United States Patent [19]
Zandi et al.

[11] Patent Number: 5,471,207
[45] Date of Patent: Nov. 28, 1995

[54] COMPRESSION OF PALETTIZED IMAGES AND BINARIZATION FOR BITWISE CODING OF M-ARY ALPHABETS THEREFOR

[75] Inventors: Ahmad Zandi, Cupertino; David G. Stork, Sanford; James Allen, Mountain View, all of Calif.

[73] Assignees: Ricoh Company Ltd., Tokyo, Japan; Ricoh Corporation, Menlo Park, Calif.

[21] Appl. No.: 200,233

[22] Filed: Feb. 23, 1994

[51] Int. Cl.$^6$ .................................................. H03M 7/30
[52] U.S. Cl. ........................ 341/107; 341/51; 382/232
[58] Field of Search ...................... 341/51, 107; 382/56; 348/390, 393

[56] References Cited

U.S. PATENT DOCUMENTS

| | | | |
|---|---|---|---|
| 5,095,374 | 3/1992 | Klein et al. | 382/56 |
| 5,297,220 | 3/1994 | Nomizu | 382/56 |
| 5,349,348 | 9/1994 | Anderson et al. | 341/51 |

OTHER PUBLICATIONS

H. Gharavi, "Conditional Entropy Coding of Digital Pictures," Journal of IRE, vol. 56, No. 5, pp. 213–218, May, 1986.

IBM Technical Disclosure Bulletin, vol. 35, No. 7, Dec. 1992, pp. 315–316.

Y. Chin, et al., "Lossy Compression of Palettized Images", *ICASSP-93*, vol. V, pp. 325–328.

*Primary Examiner*—Howard L. Williams
*Attorney, Agent, or Firm*—Townsend and Townsend and Crew; Philip H. Albert

[57] ABSTRACT

The invention provides an improved method and apparatus for compression of palettized images. Input symbols in an M-ary alphabet are binarized based on a context model of the input data, where the binarization is selected to provide good compression by a binary encoder. The particular binarization is determined from a reindexing table which maps each input symbol to a number of binary values. The mapping is determined from the images to be compressed, and is typically transmitted with the compressed images as overhead. The mapping is a local minimum of the bitwise entropy of the binarization. With or without reindexing the input, the symbols can be converted compressed in parallel, with the bits of the input symbols buffered and reordered as necessary to ensure that bits needed for context of a bit being decoded are available before the decompressor decodes the bit being decoded. The decompressor includes a means for performing the opposite reordering such that the output of the decompressor is the same as the input to the compressor.

24 Claims, 12 Drawing Sheets

| Context | Most Probable Symbol (MPS) | Pclass |
|---|---|---|
| $C_0$ | $Sym_0$ | $Pclass_0$ |
| $C_1$ | $Sym_1$ | $Pclass_1$ |
| $C_2$ | $Sym_2$ | $Pclass_2$ |
| $C_3$ | $Sym_3$ | $Pclass_3$ |
| ... | ... | ... |
| $C_{N-1}$ | $Sym_{N-1}$ | $Pclass_{N-1}$ |

FIG. 4 Layout of Memory 116

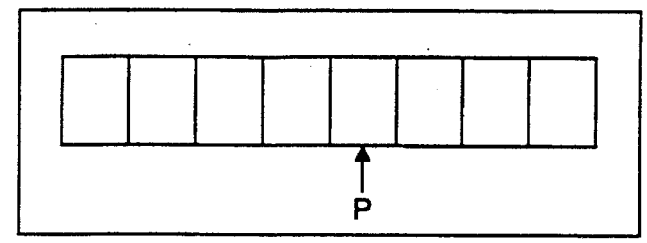
(a) Bit Position
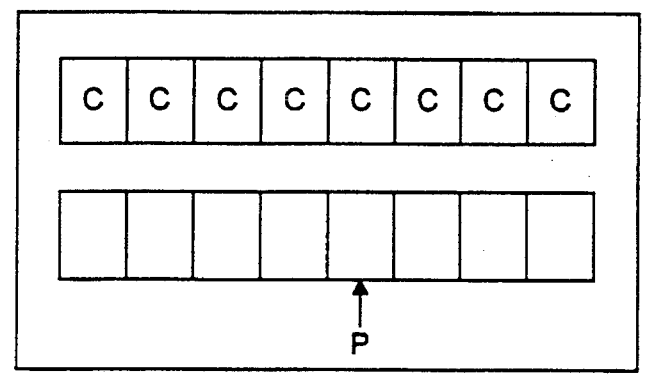
(b) Bit Plane
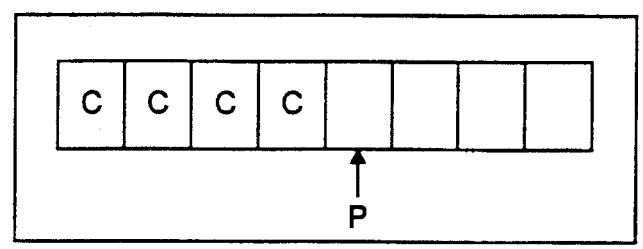
(c) Bitwise Dependent
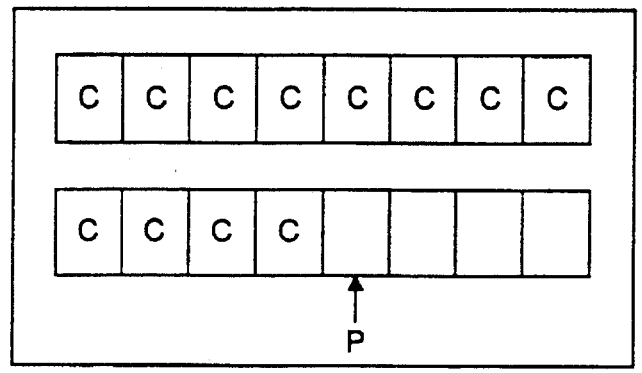
(d) First Markov Bitwise
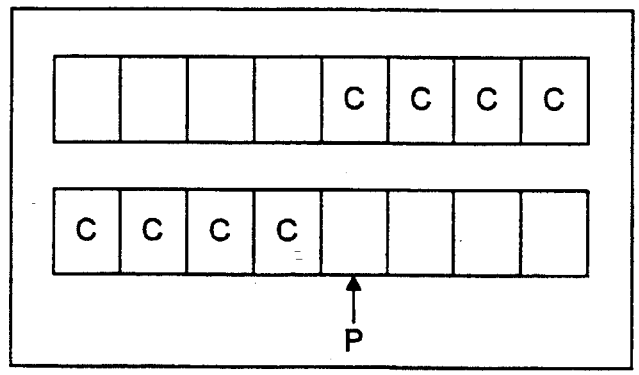
(e) Mixed
Fig. 8

| 21 | 15 | 14 | 3 | 2 | 1 | 0 |
|---|---|---|---|---|---|---|
| State Info (Pclass, MPS) | | Count (MPS Run Length) | | LPS Present | Zero Count | Continue Bit |

FIG. 12

|  | t=0 | t=1 | t=2 | t=3 | t=4 | ... |
|---|---|---|---|---|---|---|
| Input Stage: | A3 | A2 | A1 | A0 | B7 | ... |
| Intermediate Stage (IS 1): (context dependent) | A4 | A3 | (A2) | A1 | A0 | ... |
| Intermediate Stage (IS 2): | A5 | A4 | A3 | A2 | A1 | ... |
| Intermediate Stage (IS 3): | A6 | A5 | A4 | A3 | A2 | ... |
| Output Stage 1: | A7 | A6 | A5 | A4 | A3 | ... |
| Output Stage 2: |  | A7 | A6 | A5 | A4 | ... |

FIG. 13(a)

|  | t=0 | t=1 | t=2 | t=3 | t=4 | ... |
|---|---|---|---|---|---|---|
| Input Stage: | A6 | B6 | C6 | D6 | A5 | ... |
| Intermediate Stage (IS 1): (context dependent) | D7 | A6 | (B6) | C6 | D6 | ... |
| Intermediate Stage (IS 2): | C7 | D7 | A6 | B6 | C6 | ... |
| Intermediate Stage (IS 3): | B7 | C7 | D7 | A6 | B6 | ... |
| Output Stage 1: | A7 | B7 | C7 | D7 | A6 | ... |
| Output Stage 2: |  | A7 | B7 | C7 | D7 | ... |

FIG. 13(b)

COMPRESSION OF PALETTIZED IMAGES AND BINARIZATION FOR BITWISE CODING OF M-ARY ALPHABETS THEREFOR

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

CROSS REFERENCE TO RELATED APPLICATIONS

U.S. Pat. No. 5,381,145 entitled "Method and Apparatus for Parallel Decoding and Encoding of Data", assigned to the assignees of the present application, is incorporated herein by reference for all purposes, and is hereinafter referred to as the "ABS Coder" reference.

BACKGROUND OF THE INVENTION

The present invention relates to the field of image compression. More specifically, to the compression of palettized images using an entropy encoder and also using parallel entropy encoder.

Image compression generally operates on digitized images. To digitize an image, the image is sampled at various points in the image, often referred to as pixels. Each pixel has a location within the image and a pixel color. In one example, an image is represented by a two-dimensional array of 1024 by 768 pixels, where each pixel can take on one 24-bit value. Each pixel value can represent a different color, thus allowing the image to be represented using any of $2^{24}$, or 16,777,216, possible colors.

In many applications, each pixel value is associated with a particular color in the image at the time the image is digitized. With this arrangement, the color of a given pixel can be determined by the pixel's value. In other applications, the digital image is a palettized image. In a palettized image, the value of each pixel is not fixed to a color, but is a pointer to an entry in a color palette table. When a palettized imagine is to be displayed, the color of a pixel is found by using the pixel value as an index into the color palette table which maintains the relationship between each pixel value and the color assigned to that pixel value.

A palettization is a selection of a few colors from the set of all possible colors, e.g., 256 ($2^8$) out of 16,777,216 ($2^{24}$) colors, and a method for substituting an arbitrary color by one from the selected few colors. As a result, a palettized image can be efficiently stored as a code book listing (continuing the above example), for each of 256 indices, the full 24-bit color description of the selected colors, followed by the 8-bit index of each pixel in the image. Thus, a space savings occurs by fully describing the selected colors only once and referring to each pixel by just an index into the code book.

Image compression is important in many imaging applications because of the amount of data needed to represent an image. In the above example 24×1024×768, or 18,874,368 bits (2,359,296 bytes) are needed to represent a single uncompressed image, or 8×1024×768 (6,291,456 bits) in the case of a palettized image. Compression is even more essential with motion video, which requires a continuous stream of images at a high frame rate, such as 30 images per second. Not only does compression save image storage memory, compression also allows efficient transfer of images over limited bandwidth channels. Of course, for applications such as moving images, the images must be able to be decompressed fast enough so that they can be displayed at the frame rate. While the compression can be done in advance, often the application requires real-time decompression. In embodiments where the compression is done in advance, the input to the decompressor is a block of compressed data which can be stored in a memory device and decompressed at any time after the compression.

One measure of how well compression works is the compression ratio. The compression ratio is the ratio of the size of the uncompressed data to the compressed data. Another measure of the quality of compression is how fast data can be compressed and decompressed. In many applications, the speed of compression is not as important as the speed of decompression, because compression need not occur in real-time.

Often, the compression ratio is improved the more the character of the data is known. Normal digital images are generally the result of the quantization of waveforms, hence they preserve many of the characterizations of the original signal, such as the existence of relative continuity of pixel color values. With palettized images, this continuity is usually not present, and cannot be used directly to improve the compression ratio.

With palettized images, the color difference between two pixel values cannot necessarily be inferred from the pixel values, since the pixel values do not represent pixel colors. Instead they only represent indices into the code table, or color palette table, of color values. The problem of compressing palettized images can be generalized as the problem of compressing a sequence of input symbols where each input symbol is a symbol in an M-ary alphabet.

Y. Chin, et al., "Lossy Compression of Palettized Images", ICASSP-93, Vol. V, pp. 325–328, describes an example of lossy compression of palettized images. While lossy compression generally results in better compression ratios, many applications cannot tolerate the distortion which results from glossy compression, and therefore require lossless compression. With lossless compression, a signal is compressed into a compressed signal which can be decompressed to recover the original signal exactly from the compressed signal, thus no distortion is introduced.

From the above it is seen that an improved method and apparatus for compressing and decompressing palettized images is needed.

SUMMARY OF THE INVENTION

Improved compression of palettized images is provided by virtue of the present invention, which allows images to be compressed efficiently and decompressed quickly.

In one embodiment of the present invention, input symbols are symbols in an M-ary alphabet and are binarized based on a context model of the input data, where the binarization is selected to provide good compression by a binary coder. An encoder converts input symbols into codewords, while a decoder converts the codewords into the input symbols. The particular binarization is determined from a reindexing table which maps each input symbol to a number of binary values. The mapping is determined from the images to be compressed, and is typically transmitted with the compressed images as overhead.

One method for creating the mapping of the reindexing table is to assign an index to one input symbol at a time. The index assigned to an input symbol is a function of the bits of the index, the distribution of the input symbols, the contexts of the input symbols, and which symbols and indices are already assigned. For a particular input symbol, an index is assigned, from the remaining unassigned indices, which provides the minimum partial bitwise entropy given the indices already assigned and the input symbols to which the indices are assigned. While this method might not reach the global minimum bitwise entropy possible for a given set of symbol distributions and contexts, it does provide a good "local" minimum for a feasible amount of computation.

The reindexed input data is then passed through a context modeler, a probability estimation module, and a bit generator, the output of which is the compressed data. The reverse process is used to decompress the data. If necessary, the reindexing table is passed from the compressor to the decompressor as overhead. The reindexing table is not necessary where it is fixed ahead of time.

In another aspect of the present invention, context models which use a small amount of memory, yet yield good compression for palettized images are provided by a context modeler.

In another aspect of the present invention, compression and decompression are performed in parallel, and the input to the compressor is buffered and reordered to put space between a bit being encoded and the bits which determine the context and encoding of the bit being encoded. The space between a bit and its context bits is arranged to be enough of a delay so that the context bits are fully decoded when the decompressor reaches the bit whose decoding depends on the context bits. The decompressor includes a means for performing the opposite reordering such that the output of the decompressor is the same as the input to the compressor. In some embodiments, the output of the parallel compressors passes over a single communications channel with every little overhead needed to separate out the channels at the multiple parallel decompressors.

In specific embodiments, the input symbols are selected from an alphabet of 256 symbols, the reindexing process is performed by an appropriately programmed digital computer, the compression process is performed in non-real-time, and the decompression process is performed in real-time. With 256 input symbols, the reindexing table occupies 256 bytes. In a specific embodiment, the reindexing table is based on the probability distributions of input symbols over some set of images or image portions, and a new reindexing table is transmitted from the compressor to the decompressor for each set of images or image portions.

A further understanding of the nature and advantages of the inventions herein may be realized by reference to the remaining portions of the specification and the attached drawings.

BRIEF DESCRIPTION OF THE DRAWINGS

FIG. 4 is a detailed view of a memory storing a context bin probability table;

FIG. 8 is an illustration of various context models implemented by the context modelers of FIGS. 2 and 3;

FIG. 12 is a logical view of a record representing a context state; and

FIGS. 13(a) and (b) are time graphs of a pipeline coder which can process more than one input symbols at a time.

DESCRIPTION OF THE PREFERRED EMBODIMENTS

Figure 1:
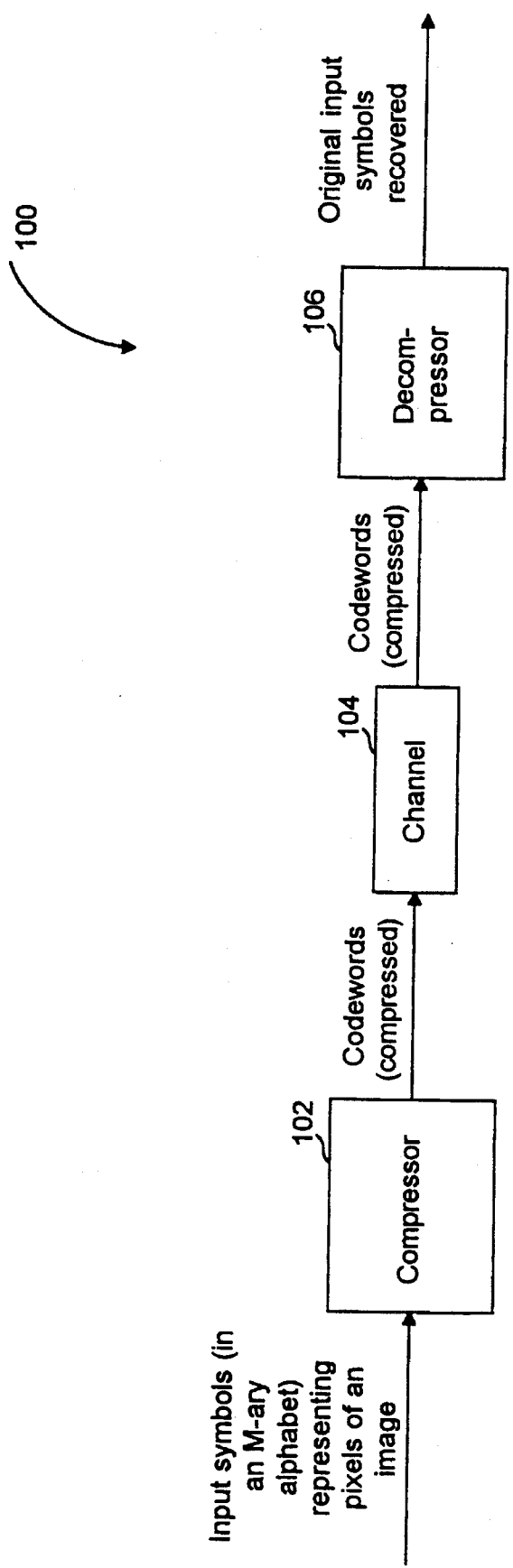
FIG. 1 is a block diagram of a data compression system, showing a compressor and a decompressor.

The description below is divided into several sections. The first section describes entropy coding. The second section describes the use of reindexing to improve compression when using entropy coding. The third section describes how context modelling can improve entropy coding performance by more accurately estimating symbol probabilities. Context modelling can be used with or without reindexing. The fourth section describes how parallel compressors and decompressors are used to improve data rates. Finally, the fifth section describes how buffering is used to facilitate parallel implementations and still maintain causality to allow data to be decompressed in parallel.

ENTROPY CODING

Entropy coders are known in the art of data compression. An entropy coder which codes input symbols into output codewords is a lossless process, i.e., the original input symbols can be extracted from only the output codewords. An entropy coder is so named because it attempts to achieve a compression ratio close to the theoretical upper bound dictated by the entropy of the input symbols. An encoder and a decoder are generally designed so that the decoder is the inverse of the encoder. The term "coder" refers to an apparatus which is either an encoder or a decoder, or both.

The full details of an entropy coder will not be described herein, only certain details which are pertinent to the present invention. In an entropy encoder, input symbols are read from an input and one or more input symbols effect the output of a codeword. The particular input symbol(s) and output codeword combinations are dictated by the code used. The code used, in an optimized system, is selected based on the probability distribution of the input symbols. In an adaptive entropy encoder, the code used can vary with the probability distribution. If the probability distribution is estimated well, or is known exactly, and codes optimized for that probability distribution are used, good compression will result.

If the input symbols are bits (i.e., a symbol is either 0 or 1), the encoder is a binary entropy encoder. Binary entropy encoders are preferred over other entropy encoders where simplicity of hardware is important. The ABS coder is a binary entropy coder. In a binary entropy encoder, input symbols are supplied to a bit generator, which accepts one or more bits at an input and outputs a codeword for those input bits accepted. If the bit generator is provided with an indication of the probability distribution of the 0's and 1's in the input stream, it can use that information to pick the proper code to use. Alternatively, the bit generator could just be instructed as to which code to use, as determined by a probability estimation module. The codes could change as the bit generator determines that the output codewords are, on average, too long or short for the actual probability distribution of the input symbols. For further details, refer to the ABS coder reference.

It is important that the probability distribution of 0's and 1's be estimated well. If a binary entropy encoder is used, the pixel values of an image to be compressed, which are symbols from an M-ary alphabet where M is greater than two, need to be binarized first. As it turns out, in some cases, the particular binarization chosen affects the entropy of the bit stream input to the binary entropy encoder and, as explained above, the entropy places a limit on how much a bit generator can compress the input bit stream. Where the distinction is not clear, "pixel input symbol" or "pixel symbol" is used to refer to an element of the data to be compressed before it is binarized, which is an input to a compressor and "binary input symbol" is used to refer to an input symbol which is input to a bit generator of a binary entropy encoder.

With non-palettized image data, the pixel symbols can be binarized according to color information which is implied in the pixel's value. For example, suppose a pixel value takes one of 256 values, and the value taken indicates the color of the pixel. In this case, if like colors are represented by like 8-bit values, it might be safe to assume that 00001100 and 00001101 are more similar in color than 00001100 and 11111111. In a number of examples discussed herein, M is 256, and symbols in the M-ary alphabet are represented by K-bit binarizations, where K=8. It should be understood that other values of M and K are possible, including values of M which are not even powers of two, the only limitation being that $K \geq \log_2 M$.

Returning to the example, since in the typical image, adjacent pixels are often of similar color, the number of bits required to express each pixel can be reduced by representing each pixel by the difference in pixel color value between the pixel and a neighboring pixel. This preprocessing of the data will generally result in better compression, since the number of bits needed to represent values is related to the entropy of the set of values. However, in the case of pixels in a palettized image, a particular relationship between two colors is not implied from a correlation between the bits of such 8-bit representations. For example, in a palettized image, 00001100 and 00001101 could be very different colors and 00001100 and 11111111 could be nearly identical colors. It all depends on the palette.

Thus, the compression of palettized images can be improved by accurately estimating the probability distribution of the bit stream, and by selecting the binarization of the input pixel symbols which provides a low entropy bit stream to a bit generator. Solutions to the former problem are discussed in the section below entitled "Context Modelling" and solutions to the latter problem are discussed in the section below entitled "Reindexing".

DECOMPRESSION

For a decompressor to correctly decode input symbols from output codewords, the decompressor needs to know which code is used for which codewords, unless the encoder is not an adaptive encoder and uses a fixed code. Since the overhead of sending data indicating the code would diminish the usefulness of the compression, the decompressor should be able to extract an indication of the codes used from the codewords. This is possible if the code used on a given binary input symbol is determined by a probability estimate which depends only on bits which have already been coded into codewords. If this is true, the decompressor, using a feedback loop and storing information about the input symbols as they are recovered, can determine what code is used solely from data which is already decoded.

CONTEXT MODELLING

The more precise the probability estimates, the more optimized the codes used are to the data compressed. One way to refine the probability estimates is to maintain probability estimates for multiple contexts. As used herein, the context of an input pixel is the pixel or pixels in a defined relationship to the input pixel. For example, in one context model, the context of an input pixel is determined by the pixel above the input pixel. When determining the context of a bit in the bit stream input of a bit generator, the context is provided by pixels and or bits in a defined relationship to the input bit. The relationship is determined by the context model.

FIG. 8 is a graphical depiction of five context models. In each model, a pointer P indicates the bit position of the current input bit to the bit generator of the current input symbol to which the context applies. In all the contexts shown, the context is derived from some subset of the bits of the current input symbol, the bit position indicated by P, and the bits of the symbol for the pixel in the image above the pixel for the current input symbol, which is referred to as the "above" symbol. It should be understood that other pixels, such as the pixel to the left of the current pixel, or other context models not shown could work equally well.

Each context model specifies how the context is determined, and the number of possible contexts can be easily calculated. For each context model, a probability estimate is maintained, and that probability estimate is used when a symbol having that context occurs. The term "context bin" is often used to indicate which context a symbol falls into.

Referring to FIG. 8, context model (a) is a bit position context model. With this model, the only context is the bit position, which requires K context bins. Where K=8, this is a reasonable number of context bins.

Context model (b) is a bit plane context model, so named because there is a set of M contexts for each bit plane. Thus, there are M×K (2048, in the case of M=256, K=8) contexts. One characteristic to note is that the contexts of the current pixel in models (a) and (b) are independent of the bits used to represent the current pixel.

Context model (c) is a bitwise dependent context model, where the context is determined by the bit position if the current bit and the prior bits in the current symbol. In this model, there are $2^K-1$ contexts (1 context when P is at the first bit, 2 contexts for the next bit, etc.). For K=8, this model provides 255 contexts. Note that the context of a bit does not rely on the values for bits not yet encoded so that the decoder does not need undecoded bits to determine how to decode a bit (FIG. 8 assumes a top-to-bottom and left-to-right processing sequence).

Context model (d) is a good context model, which takes into account all the bits of the above pixel and the bits of the input pixel which are prior to the current bit. This context model combines the information of models (b) and (c), and thus provides M×($2^K$−1) contexts. While this context model might provide a fine division of the contexts, the memory needed to store values for the contexts might be prohibitive in a hardware implementation of a compressor or decompressor. For M=256 and K=8, this model requires 65,280 contexts. If each context requires 8 bits of storage, this context model would require a 64K memory for just this purpose. However, one advantage to this context model over models (a) and (b) is that the performance of a compressor using this model is good regardless of the binarization used, since prior bits of the current pixel are used to determine contexts.

Context model (e) is a mixed context model, which has been shown to be a good compromise between memory requirements and the quality of the context model. In this model, the context is the P−1 prior bits of the current input symbol and the K−(P−1) last bits of the above symbol. This requires $2^K$ contexts per bit position (2048 contexts for K=8).

The context model is generally fixed between the compressor and the decompressor, but there is nothing to prevent the compressor and the decompressor from switching context models, so long as they agree on which context model is used at any given time. If variable context models are allowed, a mechanism must exist for ensuring that the context models are the same, such as communications channel overhead indicating the current context model.

The above discussion of entropy encoding and context modelling is provided as a foundation for the explanation of the data compression system shown in the figures, which will now be described. Referring to FIG. 1, an embodiment of a data compression system 100 according to the present invention for compressing data comprising symbols in an M-ary alphabet is shown, including a compressor 102, a channel 104, and a decompressor 106. The input to compressor 102 is a stream of input pixel symbols each representing a pixel value in an image, although other types of data could be used.

The input pixel symbols are converted to compressed codewords by compressor 102, transferred through channel 104, to decompressor 106. From only the received codewords, and possibly knowledge of the operation of compressor 102 and a reindexing table (if used), decompressor 106 recovers the original input symbols or their equivalent. In some cases, the original input symbols are translated from one representation to a reindexed representation and the data compression system manipulates the decompressed symbols without actually performing the inverse of the reindexing.

One benefit of the present invention is increased compression ratios for input symbols which are pixel values in a palettized image.. Therefore, the compression provided by the present invention is useful wherever channel 104 has limited bandwidth. Examples of channel 104 include a communications channel such as exists between an image memory and a display device, or a storage device and a device using the stored image. Channel 104 might also represent the transfer of compressed data in the form of devices with memory, such as a game cartridges, which are compressed in one location, transferred to another location where they are decompressed. In the latter situation, the bandwidth limitation of channel 104 shows up as a limitation in the amount of memory available in the device for storage.

Figure 2:
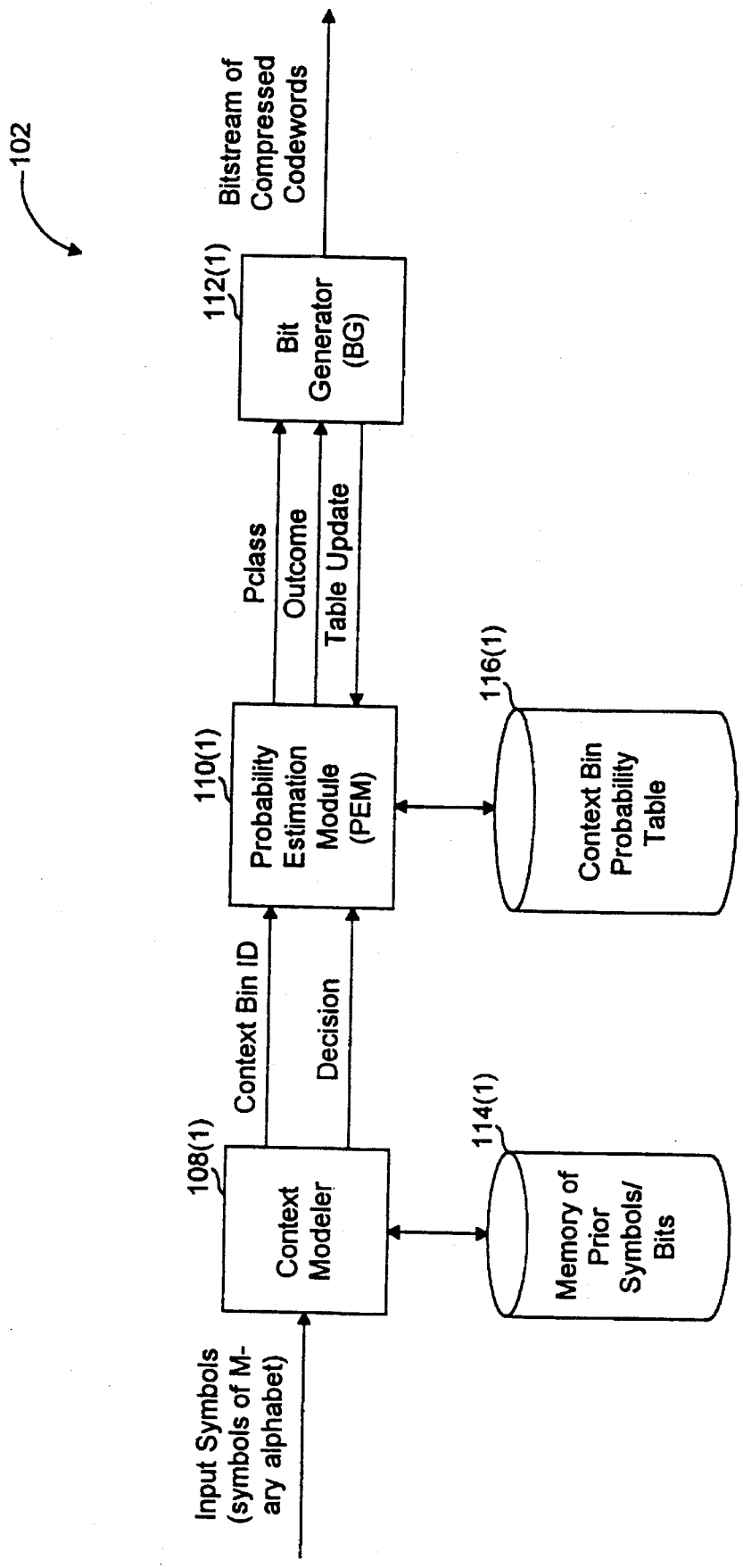
FIG. 2 is a block diagram of the compressor shown in FIG. 1.

Referring to FIG. 2, compressor 102 includes a context modeler 108(1), a probability estimation module (PEM) 110(1), a bit generator 112(1), a context memory 114(1), and a context bin probability memory 116(1). The parenthetical numbers are used to distinguish similarly numbered elements found in both compressor 102 and decompressor 106. References to an element which are generally applicable to either compressor 102 or decompressor 106 are shown without the parenthetical number. Although the present invention is described in connection with a particular compressor 102 shown in FIG. 2, other compressors may work equally well. For example, not all compressors require the coupling between PEM 110 and bit generator 112 shown, and PEM 110 might rely on data other than that provided by bit generator 112 to update its probability estimates.

Context modeler 108(1) is coupled to the input of compressor 102 and thereby receives the input pixel symbols. If a reindexer is used, the input to compressor 102 is a stream of reindexed input pixel symbols. Context modeler 108(1) includes two outputs, a Context Bin ID output and a Decision output, which are both inputs to PEM 110(1). Assuming that the input is binarized to a symbol of K bits, then context modeler 108(1) outputs K binary "decisions" per input pixel symbol. For each decision, context modeler 108(1) also outputs one context bin identifier.

Context modeler 108(1) is also coupled to memory 114(1) to address data elements therein and to read/write data thereto relating to the occurrence of symbols in the input stream, as necessary to determine the context of the input pixel symbol presented at its input. The particular layout of data elements in memory 114(1) depends on the context model.

PEM 110(1) receives the two inputs from context modeler 108(1) and has two outputs to bit generator 112(1): a probability class (Pclass) output, and an Outcome output. PEM 110(1) is also coupled to memory 116(1) to address data elements therein and read and modify values of those data elements, and to bit generator 112(1) to receive a table update signal. For each decision input to PEM 110(1), PEM 110(1) outputs one outcome bit and one Pclass. The Outcome bit depends on the Decision input bit and a most probable bit symbol (MPS) for the context bin associated with the Decision input bit. The outcome bit indicates whether the Decision input bit is the MPS or not. The opposite of the MPS (which is either 0 or 1, since the bit generator encodes binary symbols) is a least probable symbol (LPS).

Bit generator 112(1) receives a stream of Outcome bits and their associated Pclass. Thus, bit generator 112(1) receives K Outcome bits and an associated Pclass for each pixel symbol input to context modeler 108(1). From these two input streams, bit generator 112(1) produces a stream of compressed codewords, as explained in the ABS coder reference. With a properly designed bit generator, the Outcome bit stream can be recovered from the output codewords, and the codewords comprise fewer bits than the input bit stream. The Pclass value is used to select a code to use to encode the bit stream. Alternatively, PEM 110(1) might store the probability distribution of the MPS and LPS for each context and provide the probability to the bit generator.

As the ABS coder reference teaches, some binary codes are optimized to particular probabilities of symbols (0's and 1's) in the input stream. For example, if 0's and 1's are equally likely at the input to a bit generator, then an optimum code is one with no compression, i.e., one bit output for each input bit. The optimality of a code is determined by how close the average codeword length approaches the theoretical entropy of the input bits.

Since compressor 102 operates on a pixel symbol at a time and PEM 110 and bit generator 112 operate on a bit of that pixel at a time, the concepts of a "current" pixel and a "current" bit have meaning, and are used in the following description to explain the operation of compressor 102 and decompressor 106. However, it should be understood that, in a complex compressor, symbols might not be operated upon one at a time, but the concept of a "current" symbol is nonetheless still applicable. It should also be understood that elements may operate in a pipeline manner, such that the current symbol for one stage might be different than the current symbol for another stage.

In a compression operation, compressor 102 accepts each input pixel symbol in sequence and outputs a stream of codewords, although not necessarily outputting a codeword for a fixed number of input symbols. In processing one pixel symbol, the symbol is binarized and the binarization is input to context modeler 108(1). Context modeler 108(1) evaluates the binarization on a bitwise basis, outputting each bit at the modeler's Decision output along with a Context Bin ID identifying the context of the bit. For example, if the context model used is the bit position context model, the Context Bin ID merely indicate as the bit's position within the binarization of the input pixel symbol. For the bit position context, only a pointer to the current bit need be stored, but for other context models, each pixel which affects the context of another pixel is stored in memory 114. If the context model includes the pixel above the current pixel, then it would be sufficient to store one row of pixels in memory 114.

Where the input symbols represent pixel colors in a two-dimensional array of pixels forming an image, the order of scanning is not as important as for a block of text, wherein context is generally provided by the letters near a current letter. However, merely for example, this discussion assumes the two-dimensional array is scanned into compressor 102 in a predetermined order, such as from a top row to a bottom row, and from left to right within each row. With this scanning order, the pixel above the current pixel can be used for context, since the above pixel will have already been decoded by the time it is needed to provide context for the decoding of the current pixel, and since, in a typical image, the pixel directly above the current pixel is often a color which is likely to be paired with the current pixel.

There is nothing particular about the context pixel being the pixel above the current pixel, and while many context models are possible, successful lossless decompression from just the compressed data stream requires that the current bit's context model not include bits or symbols which have not been decoded by the time the current bit is to be decoded. A few examples should clarify this point.

If the context model is a "bit position" context, the context of the current bit is the bit's position within the current input pixel, and the context ID for that context would represent the current context which, in the case of K bit binarized symbols, provides K contexts. However, if the current bit's context determines the code used to encode that bit, the context needs to be known before the bit can be decoded properly. Thus, the order of processing should ensure that the context of the current bit is known before the bit is decoded.

For each bit output by the context modeler on its Decision output, PEM 110(1) accepts the decision and the context bin ID for that decision. Based on that decision, the MPS for the decision's context bin, PEM 110(1) outputs an outcome bit and an associated Pclass. How the MPS and Pclass are determined is discussed below.

The Pclass is an estimate of how likely the MPS is in the bit stream outpost by context modeler 108(1) on the decision signal line. While the probability distribution of the MPS and LPS in the input data might be determinable exactly by scanning all the input data, the compression should not depend on the full probability distribution, since it will not be available to the decompressor prior to decoding the codewords. Therefore, the estimate, which depends only on bits previously encoded, is used. As explained in the ABS coder reference, bit generator 112(1) uses the Pclass to determine which code to use to encode the Outcome bit stream. Since a code is optimized over a range of probability distributions, Pclass defines a range of probability values, hence the name probability class. These probability class values are stored, one per context, in memory 116. Memory 116 also stores the MPS for each context. FIG. 4 shows the layout of memory 116. Initially, the Pclass for each context is a Pclass which indicates that the probability of the MPS is 50% (and of the LPS is 50%), and the MPS can be arbitrarily chosen from 0 and 1.

As the ABS coder reference teaches, one method of compressing data in an entropy encoder is to use a code which reduces long runs of the MPS to a codeword indicating the length of the run. The original stream is reconstructed by outputting a number of MPS bits indicated by the codeword, followed by the LPS, except where a run of MPS bits longer than a maximum run is broken into more than one codeword.

After a codeword is output, bit generator 112(1) signals to PEM 110(1) whether or not the maximum run of MPS bits occurred. This indication is provided on the Table Update signal line. If the maximum run length is encountered, bit generator 112(1) signals PEM 110(1) to update the Pclass table to indicate that the MPS is more likely than previously estimated. If the maximum run length is not encountered, the Pclass is changed to indicate that the MPS is less likely than previously estimated.

Figure 3:
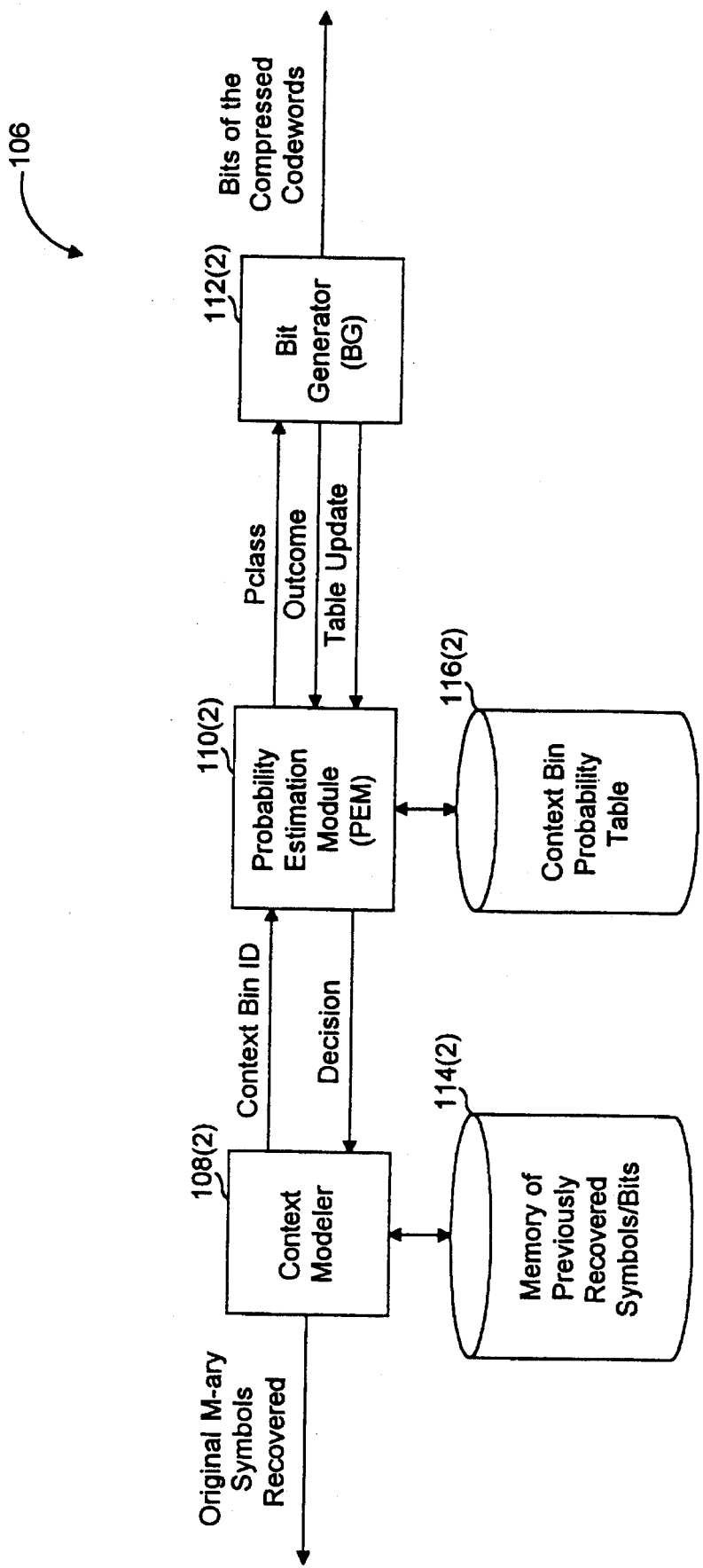
FIG. 3 is a block diagram of the decompressor shown in FIG. 1.

Decompression is just the opposite process from compression: codewords are decoded into the Outcome bit stream, the output bit stream is converted to the Decision bit stream, and assembled into pixel symbols, which are then output. Referring to FIG. 3, decompressor 106 includes a context modeler 108(2), a PEM 110(2), a bit generator 112(2), a memory 114(2), and memory 116(2). The interconnection of the modules in decompressor 106 is the inverse of compressor 102 for the bit stream, but the same direction for information about the bit stream, thus forming two feedback loops.

One feedback loop determines the code used to encode a codeword. Knowing the codes used allows bit generator 112(2) to decode the bit stream. The codes used are determined by the Pclass provided by PEM 110(2). The Pclass, as with PEM 110(1), is determined by the context and signals on the Table Update line. The context is determined from information about prior bits and pixels which is stored in memory 114(2). The feedback loop has a certain delay which can be measured in a number of bits. The delay may vary depending on the codewords received, and for most embodiments, the delay can be capped at a maximum. If the delay maximum is X bits, then the current bit's context should not depend on the X bits which preceded the current bits in the decision bit stream. This ensures that the current bit can be decoded from information that has already been processed by decompressor 106. This requirement presents particular problems, which the present invention solves, where the data needs to be decompressed in parallel.

REINDEXING

As discussed above, binary entropy encoders can compress data up to a theoretical limit. Any binarization of palettized data can be used to display an image as easily as any other (by changing the color palette table), however, it turns out that some binarizations provide a lower entropy for some context models than others. This advantage can be provided by the addition of a reindexer to the front end of compressor 102, where the reindexer selects a binarization which provides a low entropy for the data to be compressed. The opposite of a reindexer, a deindexer, can be placed at the output of decompressor 106, or the definition of the color palette can be modified to account for the change of alphabet space due to the reindexing. In some embodiments, the reindexing table might even be fixed in advance of the compression and stored in both the compressor and the decompressor.

Figure 5:
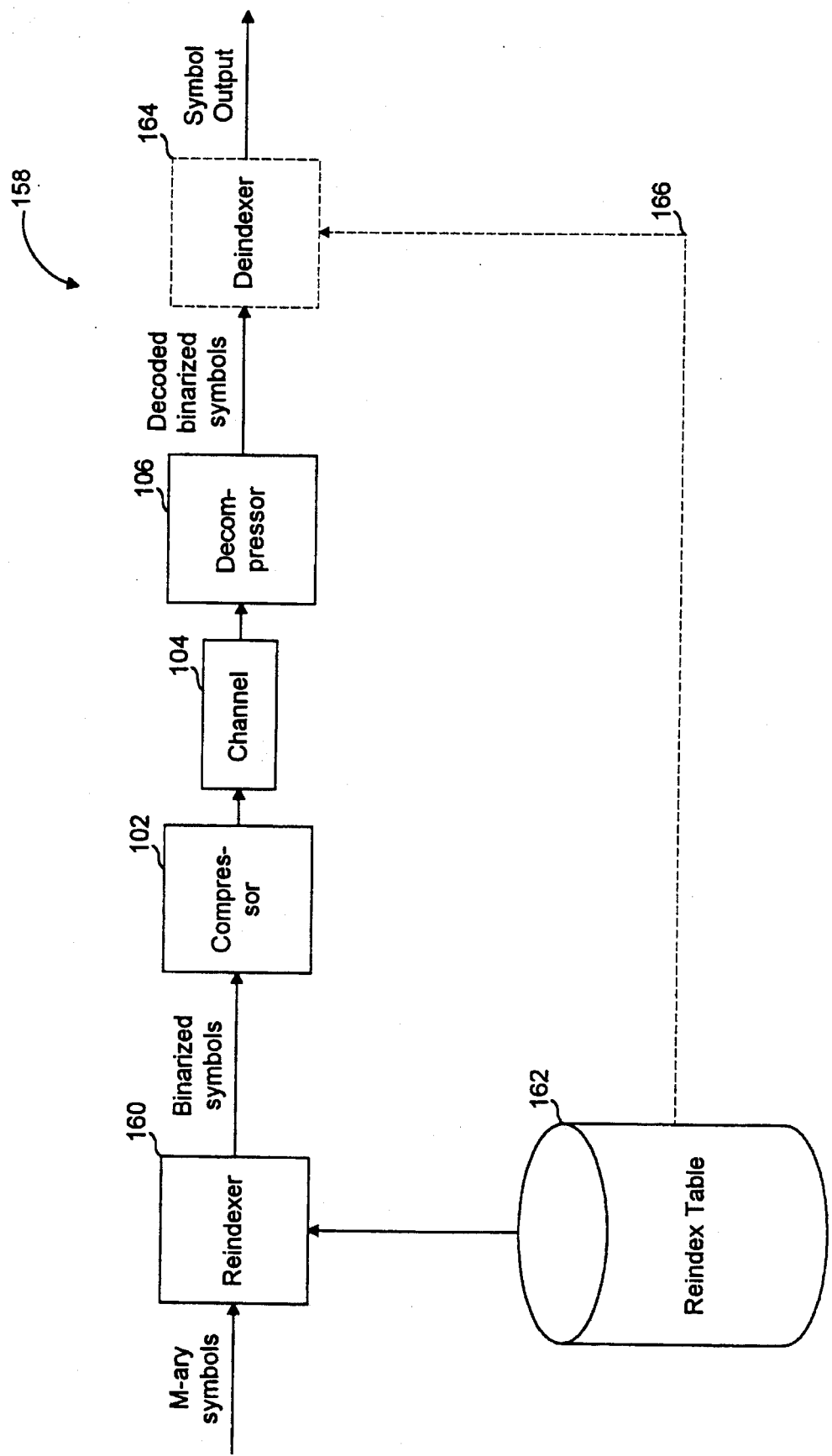
FIG. 5 is a block diagram of a data compression system including a reindexer for reindexing M-ary symbols according to a reindexing table.

FIG. 5 shows a reindexing data compression system 158 including a reindexer 160 coupled to the input of compressor 102, a reindex table 162, which is a 2×M table, and an optional deindexer 164. A signal line 166 is shown to indicate the transfer of the reindex table to decompressor 106, if the reindexing is not fixed. Since reindex table 162 is only 2×M, transmitting it along with the compressed data does not introduce significant overhead.

The operation of reindexer 160 and deindexer 164 are straightforward given a particular reindexing table 162. Reindexer 160 indexes into table 162 using a pixel symbol from its input, and reads out the corresponding reindex value. That value is output as the binarized symbol input to context compressor 102. The reindex values in table 162 are such that the operation is reversible, i.e., exactly one entry in reindex table 162 holds any given reindex value. Thus, when the output of decompressor 106, which is the same as the input to compressor 102 with the delay of the compression system, is applied to deindexer 164, if used, deindexer 164 performs the opposite transformation and outputs the index which contains the original M-ary pixel symbol. As mentioned above, if the actual original M-ary symbol is not needed, and a known binarization can be used, deindexer 164 is not needed.

Figure 6:
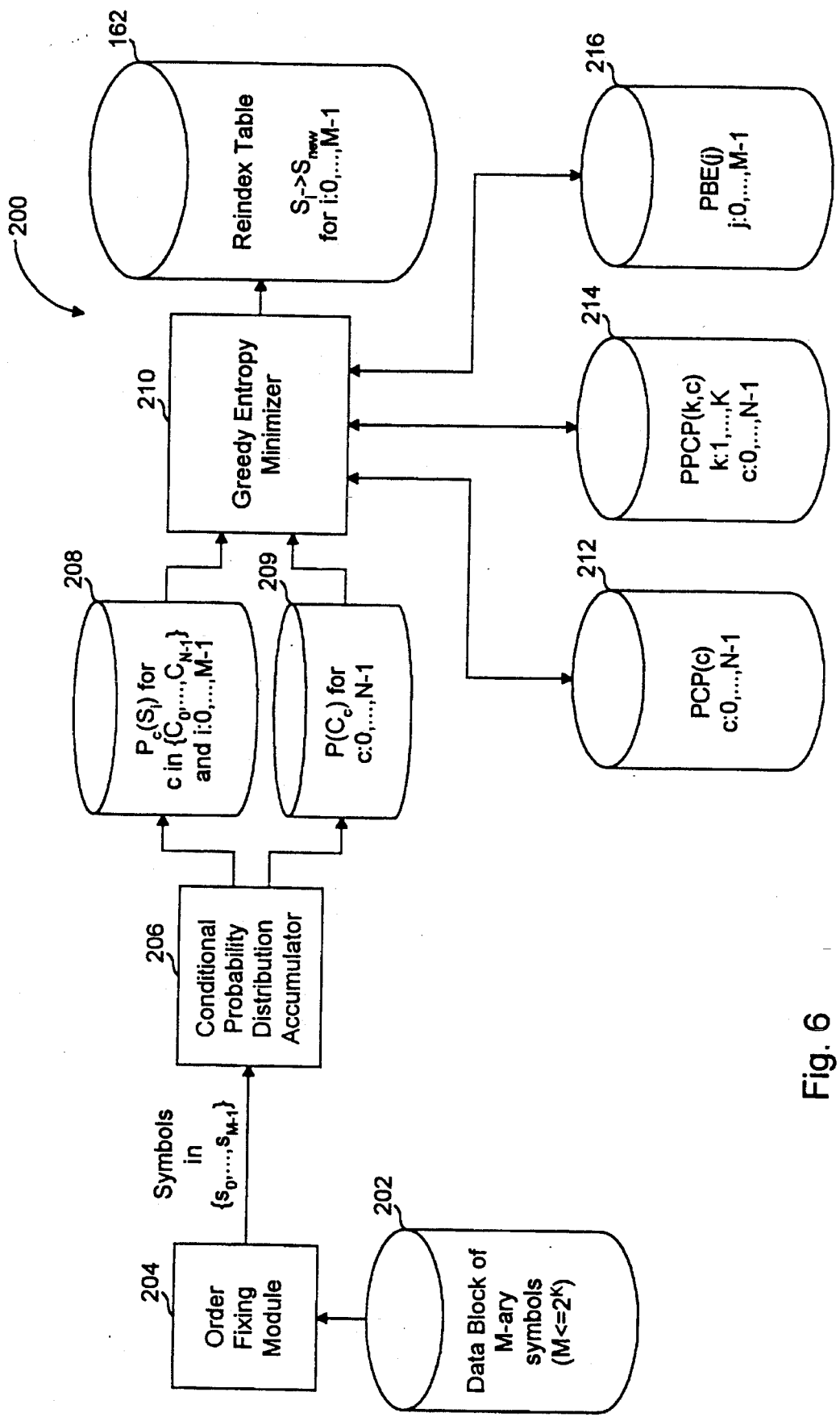
FIG. 6 is a block diagram of an index optimizer which generates a reindexing table based on the data content of a data block to be compressed.

FIG. 6 is a block diagram of a reindex table generator 200 which is used to generate the reindex values in table 162 from an input block of data. Generator 200 can be implemented in either dedicated hardware or an appropriately programmed digital computer. Using a general purpose digital computer is often less costly, especially for one-time compressions, although it tends to be slower than dedicated hardware. Fortunately, most applications allow for compression to be done in advance rather than in real-time.

The input to generator 200 is a block of pixel symbols. This block can be the entirety of the images to be compressed or some sampled subset of the images, or even portions of images. However, where compression can be done in non-real-time, it's generally not a problem to use the entire data set as the input to generator 200. In some embodiments, the image data is blocked into blocks of 16 or 256 images, and a reindex table is generated for each block of images.

Referring again to FIG. 6, generator 200 includes an order fixing module 204, a conditional probability distribution accumulator 206, a conditional probability table 208 for holding values of $P_c(S_i)$ for (i:0 to M−1 and c:0 to N−1), $P_c(S_i)$ being the probability that an input symbol $S_i$ occurs in a context $C_c$, a context probability table 209 for holding values of $P(C_c)$ for (c:0 to N−1), $P(C_c)$ being the probability of context $C_c$ occurring in the input data block, a greedy entropy minimizer coupled to output to reindex table 162, a partial conditional probability table 212 ("the PCP table") for holding values of PCP(c) for (c:0 to N−1), PCP(c) being the partial conditional probability of context $C_c$, as explained below, a partial positional probability table 212 ("the PPCP table") for holding values of PPCP(k,c) for (k:1 to K and c:0 to N−1), PPCP(c) being the partial positional conditional probability of context $C_c$ and bit position k, as explained below, and a partial bitwise entropy table 216 for holding values of PBE(j) for (j:1 to M−1) as explained below. The uses of the various tables will become more apparent after reading the description accompanying the flowchart of FIG. 7.

Generator 200 operates as follows. Order fixing module 204 converts each symbol from data block 202 into an ordered symbol, $S_i$, where i:0 to M−1. Since effect of the reindexing table 162 is to reorder the symbols, the particular order used is of less importance than the operation of the remainder of the system. In one possible embodiment, symbols in data block 202 are already stored as K-bit ($K \geq \log_2 M$) binary values, in which case module 204 is not needed. In another embodiment, $S_0$ is assigned to the most frequent pixel symbol in data block 202, $S_1$ to the next most frequent, and so on, to $S_{M-1}$ for the least frequent pixel symbol. This is sometimes known as the zeroth order, or contextless, symbol frequency distribution.

Module 204, if used, reads pixel symbols from data block 202 and passes the binary representation of the ordered symbols to accumulator 206, which accumulates probabilities to tables 208 and 209. Entropy minimizer 210 then reads the contents of tables 208 and 209, reads values from and writes values to tables 212, 214 and 216, in order to generate its main output, which becomes the contents of table 162. In some embodiments, minimizer 210 maintains an internal table of which indices of table 162 are assigned, and in other embodiments, minimizer 210 determines which indices are assigned by looking at table 162.

Figure 7:
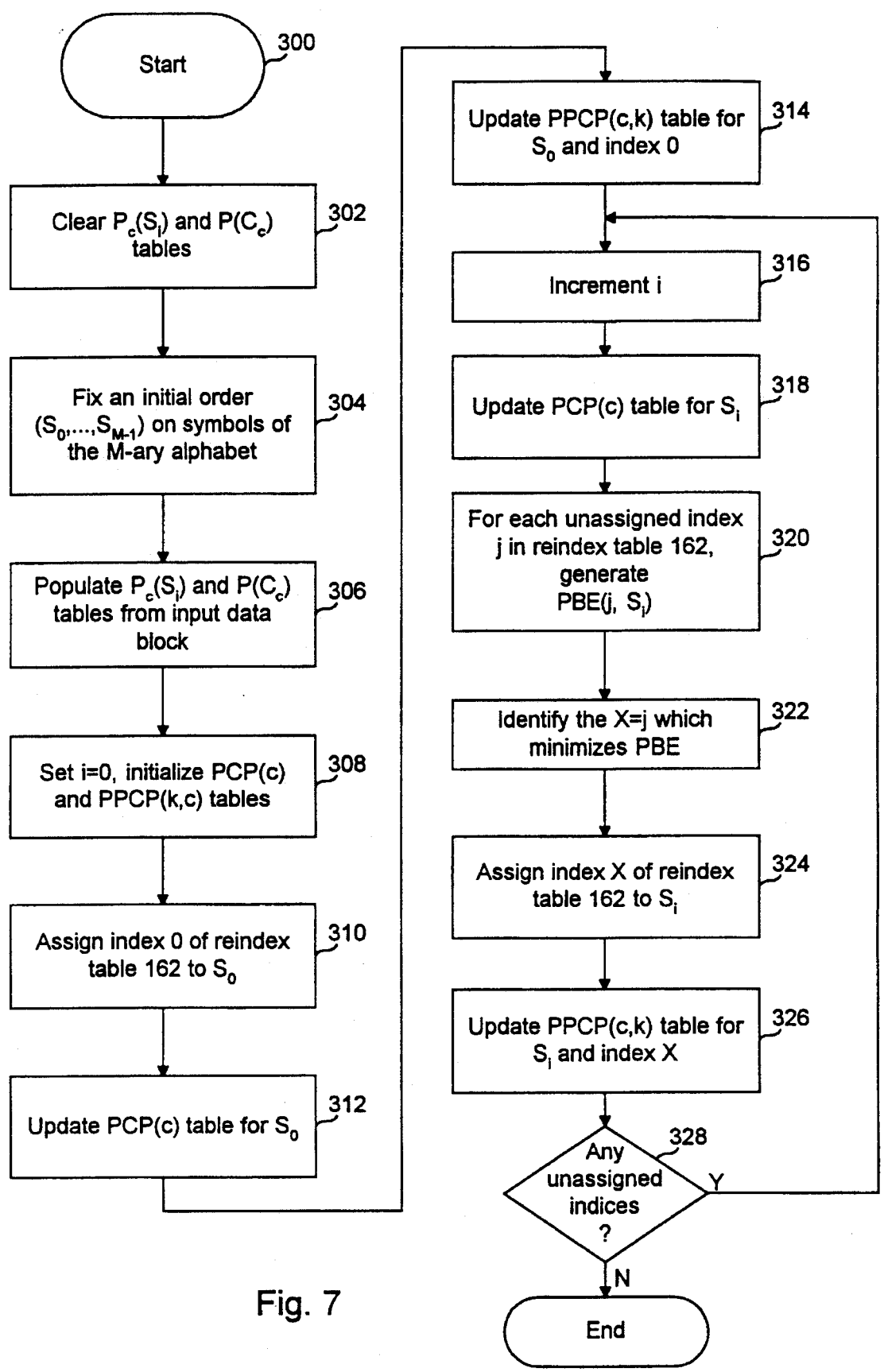
FIG. 7 is a flowchart of a process performed by an index optimizer to determine a suitable reindexing table.

The operation of reindex table generator 200 is best understood with reference to the flowchart shown in FIG. 7 in combination with FIG. 6. The flowchart shows blocks 300, 302, 304, 306, 308, 310, 312, 314, 316, 318, 320, 322, 324, 326 and 328. Block 300 indicates the start of a process of generating a reindex table from a data block. The steps in blocks 302 and 306 are typically performed by accumulator 206, the step in block 304 by module 204, with the remainder typically performed by entropy minimizer 210. The process flow proceeds in block number order from block 302 to block 328, and from block 328, either ends or loops back to block 316 as indicated below.

In block 302, accumulator 206 clears tables 208 and 209. In block 304, module 204, if used, orders the input symbols into $S_0$–$S_{M-1}$, and in block 304, accumulator 206 populates tables 208 and 209. When populated, table 208 contains an entry for each combination of a context and an input symbol, where an entry (c,i) of table 208 indicates the probability of the symbol $S_i$ occurring given the context $C_c$. When populated, table 209 contains an entry for each context, where an entry c of table 209 indicates the probability of the context $C_c$ occurring regardless of the symbol. There are M possible values for i, and the contexts are $\{C_0, \ldots, C_{N-1}\}$, giving N possible contexts. Thus, table 208 contains M×N entries and table 209 contains M entries.

In one embodiment, the context is the symbol for the pixel above the pixel from which $S_i$ was taken, in which case N=M. In other embodiments, the context is the symbol for the pixel to the left (N=M), or the context is two symbols (N=M$^2$). However, using a two-symbol context would require M$^2$ contexts for each input symbol and consequently, tables 208 and 209 would be very large for most values of M. In yet other embodiments, there are fewer than M contexts. For example, if all possible symbols are grouped into less than M groups, and the context for a context pixel is the group which contains the pixel above the context pixel, then fewer than M contexts will occur. For example, if all the symbols were grouped into groups of four symbols each, N would be M/4. Of course, for this reduction in contexts to be helpful, some intelligent means of grouping symbols should be used.

At block 308, minimizer 210 sets a loop variable, i, to zero, and initializes the reindex table 162, PCP(c) table 212 and PPCP(k,c) table 214. Although block 308 is shown after block 306, their order could be reversed, since neither step depends on the result of the other. Reindex table 162 is initialized by indicating, using flags or other known means, that all entries in table 162 are empty and no indices therein are assigned. The PCP table is initialized by setting PCP(c)=0 for all c, and the PPCP table is initialized by setting PPCP(k,c)=0 for all k and c.

At block 310, minimizer 210 assigns index 0 to $S_0$, and updates the reindex table accordingly.

At block 312, minimizer 210 updates the PCP(c) table for the added index $S_0$, by setting PCP(c)=$P_c(S_0)$ for each c.

At block 314, minimizer 210 updates the PPCP(c) table for the added index $S_0$, by setting PPCP(k,c)=$P_c(S_0)$ for each (c,k) pair in which the k-th bit of the radix 2 representation of the assigned index is 1. This step is not necessary when the first assigned index is 0, since none of the bits of the index are 1, but this step is needed where a nonzero index is assigned first.

At block 316, minimizer 210 increments i, which on the first pass through block 316 results in i=1. The process of blocks 316 through blocks 328 repeats for each i between 0 and M-1, assigning one index in reindex table to a symbol each loop. Of course, the final loop, where i=M-1, is not really necessary, since only one index will remain at that point to be assigned to $S_{M-1}$.

At block 318, the PCP table is updated for the symbol $S_i$, according to PCP(c)=PCP(c)+$P_c(S_i)$. After this step, the probability, given context $C_c$ and the alphabet of symbols A'={$S_0, \ldots S_i$}, that the received symbol is in the alphabet A', is PCP(c), the c-th entry of the PCP table.

At block 320, a partial bitwise entropy (PBE) value is generated for each unassigned index. The unassigned indices (which number M-i at this point) are found in table 162 or are internally remembered by minimizer 210. The partial bitwise entropy for an index j and a symbol $S_i$, PBE(j,$S_i$) given that the indices 0 through i-1 have already been assigned is expressed in Equations 1-3.

$$PBE(j, S_i) = \sum_{c \in C} \left[ P(C_c) \sum_{k=1}^{K} H(P_{A',c,k,j,S_i}) \right] \quad (1)$$

$$P_{A',c,k,j,S_i}(\beta) = \frac{\left[ \sum_{s \in A', b_k(r(s))=\beta} P_c(s) \right] + \sum_{b_k(j)=\beta} P_c(S_i)}{\left[ \sum_{s \in A'} P_c(s) \right] + P_c(S_i)} \quad (2)$$

$$H(P) = -\sum_{x \in P} p(x) \log_2(x) \quad (3)$$

where A' is the alphabet of the i already assigned symbols,

H(P) is the entropy of the probability distribution P, $b_k(x)$ is the value of the k-th bit of a radix 2 representation of x, and r(s) is the reindex value for symbol S.

In block 322, minimizer 210 selects the minimum value of PBE(j,$S_i$) from all the calculated values and sets a variable X equal to the j of that minimum value.

In block 324, minimizer 210 assigns X to be the reindex value for $S_i$, and indicates the assignment in table 162.

In block 326, minimizer 210 updates the PPCP(c,k) table for $S_i$ and X according to PPCP(c,k)=PPCP(c,k)+$P_c(S_i)$ for all c and all k where $b_k(X)$=1. After this step, the probability, given context $C_c$ and the alphabet A'={$S_0, \ldots S_i$}, that the k-th bit of a reindex value for a received symbol is 1 and the received symbol is in the alphabet A', is PPCP(c,k).

In block 328, minimizer 210 checks to see if two or more reindex values have not been assigned. This is the case if i is M-2 or less at this block, which means that M-1 indices have been assigned. The last index is assigned to $S_{M-1}$.

The denominator in Equation 2 is PCP(c), which is updated in block 318 by adding $p_c(S_i)$ to it each time a symbol $S_i$ is added to the alphabet A'. The numerator in Equation 2 is PPCP(k,c) as it would be if j were the index for $S_i$. Since the updated value of PPCP(k,c) depends on the particular assignment of index j to $S_i$, PPCP(k,c) is updated after the selection of X=j, in block 326. Of course, because H is a bitwise entropy function, Equation 2 need only be calculated for either β=0 or 1, since P(0)+P(1)=1. Also, since H is a bitwise entropy, Equation 3 actually simplifies to $$H(x) = -x * \log_2 x - (1-x) * \log_2(1-x).$$

The end result of the process shown in FIG. 7 is the assignment of reindex values in reindex table 162, which is used by reindexer 160 to reindex input pixel symbols into a binarization which generally results in better compression than if the reindexing were not done.

PARALLEL PROCESSING

The above sections describe how to improve compression ratios through the use of adaptive coding, context models and reindexing. In a decompressor, adaptive coding and context modelling require feedback loops, since the manner in which a bit is decoded from a codeword stream depends on information about prior decoded bits and symbols. If the decompressor needs to quickly decode the codeword stream in real-time, parallel processing could be used to provide greater throughput.

One such parallel processing implementation is as follows. Using the bit position context model (see FIG. 8(a)), each bit in a pixel value is processed by one of eight parallel coders, each coder being dedicated to one bit position. With this arrangement, the context of the bit is known to a coder, since the bit position is the only context and the bit position is known to the coder, since it is a constant for a specific coder. However, where other context models are used to provide better compression, parallelizing a coder is not so simple.

For example, take the bitwise dependent context model shown in FIG. 8(c). If each bit of a pixel is sent to a separate coder, the bits cannot be decoded in parallel, since bits to the left of a bit being decoded must be decoded first to provide the necessary context for the bit being decoded. Thus, the use of some context models impose constraints on parallel processing.

Figure 9:
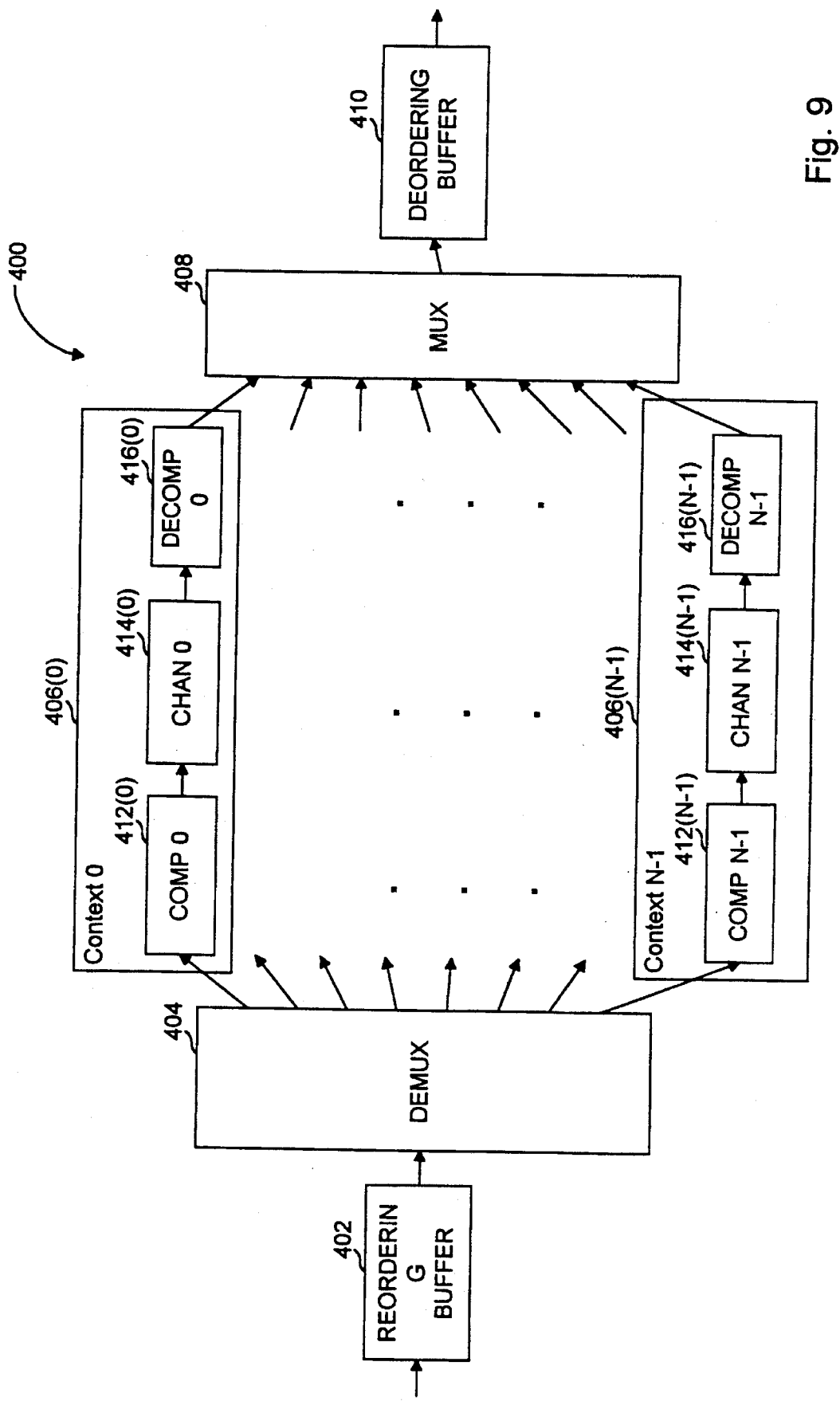
FIG. 9 is a block diagram of a parallel compression system.
Figure 10:
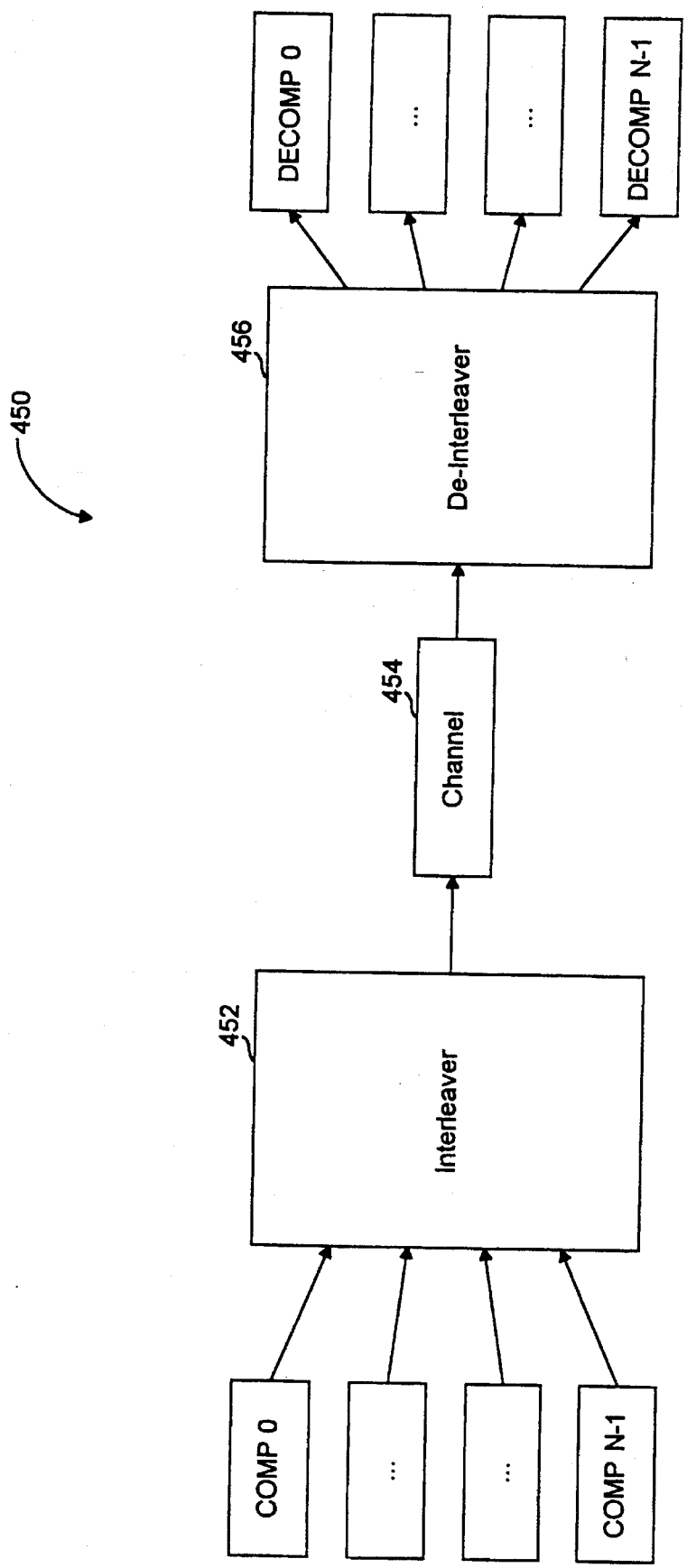
FIG. 10 is a block diagram of a parallel compression system using a single channel.
Figure 11:
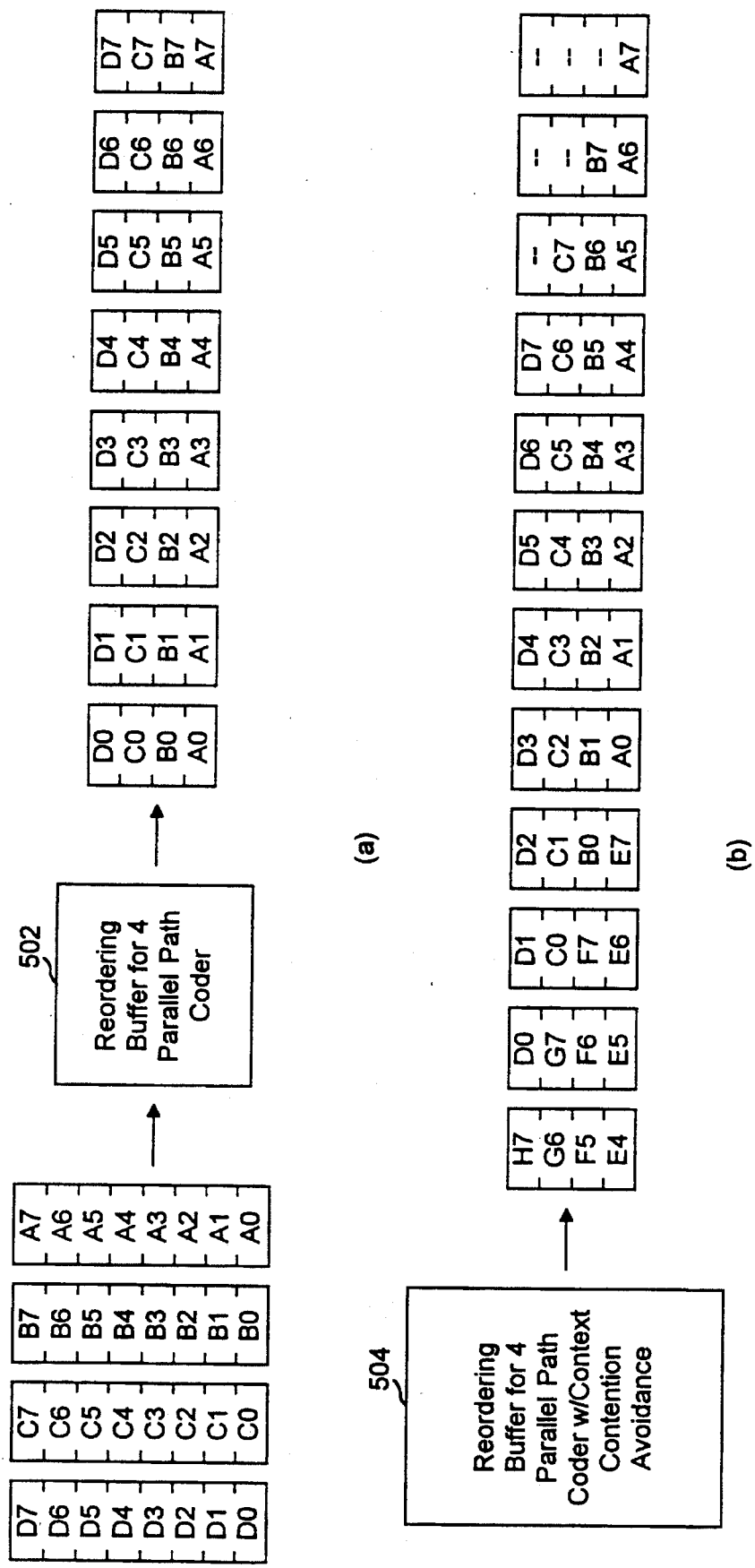
FIG. 11 is a block diagram illustrating the operation of a reordering buffer.

In one aspect of the present invention, to allow the use of a preferred context model and still allow parallel processing in a coder using that context models, a unique reordering buffer is provided. FIGS. 9 and 10 show how a reordering buffer and its inverse, a deordering buffer, are coupled to parallel coders, and FIG. 11 shows the operation of the reordering buffer in more detail.

Given a preferred context model, two constraints are imposed on a parallel coder. First, if each stage is to be independent, then among the set of bits processed in one parallel cycle, none of the bits should affect the context of the other bits. Second, if the context data is to be updated after each bit is processed, no two bits in the set of bits processed in parallel should share a context. FIG. 12 illustrates a typical context record containing context data which might be updated as a bit having a given context is processed. This record might be one line in a table such as memory 116 shown in FIG. 4.

In FIG. 9, a parallel compression system 400 according to the present invention is shown with a reordering buffer 402, a demultiplexer 404, N parallel stages 406(0, ..., N–1), a multiplexer 408 and a deordering buffer 410. System 400 can be used with or without reindexing. Each stage 406 comprises a compressor 412, similar to compressor 102, a channel 414, and decompressor 416, similar to decompressor 106.

FIG. 10 shows an alternate configuration 450, wherein an interleaver 452 is used to combine the traffic of channels 414(0, ..., N–1) onto a single channel 454, and a de-interleaver 456 which is used to separate the traffic of the single channel 454 back into the separate channels for each stage.

Referring again to FIG. 9, the symbol stream input to system 400 is buffered by reordering buffer 404. Reordering buffer 404 receives a bit stream of K (K=8 in FIG. 8) bits per symbol as explained in detail below, and outputs the bits to demultiplexer 404 which distributes the reordered bits to the parallel coders. In the "i"th parallel stage, 406(i), compressor 412(i) compresses the bits assigned to stage 406(i) into codewords, which in turn pass though channel 414(i) and are decompressed by decompressor 416(i). The output of all the stages is then combined by multiplexer 408, which outputs their combination to deordering buffer 410, which performs the inverse of reordering buffer 404. Although in the parallel coder shown, each stage is assigned to a single context, reordering allows the flexibility to divide the parallel stages in other ways according to the needs of the application. For example, each stage could be assigned to a Pclass, a group comprising a plurality of contexts, or a division specially designed to even out the traffic over the various stages.

FIG. 11(a) shows a reordering buffer 502 which is used in a parallel coder with 4 parallel stages and the bitwise dependent context model, although it may also be useful with other configurations, such as 8 or N parallel stages, a different number of bits per pixel, or a different context model. Four input bytes (pixels are shown on the left being input into buffer 502, and eight four-bit blocks are shown being output from buffer 502. The output blocks are output, one per parallel coding period, to a parallel coder, thus each of the output blocks represents a set of bits processed in parallel. If the input bits where not reordered, the blocks input to the parallel coder might just be the four most significant bits of pixel A (A7–A4), followed by the four least significant bits of pixel A (A3–A0), then the four most significant bits of pixel B (B7–B4), and so on. As should be apparent from the above discussion, without reordering, a set of bits processed in parallel would not be independent when the bitwise dependent model is used, since A4 gets its context from its position (4) and the values of bits A7, A6 and A5, which are in the same set of bits.

To solve this problem, buffer 502 reorders the input bits as shown outputting, for pixels A, B, C and D, the blocks (sets of bits processed in parallel) D7-C7-B7-A7, D6-C6-B6-A6, and so on. With this reordering, no bit relies on any other bit is its set for context. However, if two bits may still share a context. For example, D7 and C7 would share a context in the bitwise dependent context model, since the bitwise dependent context is the bit's position and the bits to the left. For D7 and C7, the bit positions are the same, and there are no bits to the left (above in FIG. 11).

This second constraint is solved, along with the first constraint, by the reordering buffer shown in FIG. 11(b). In this buffer, bits grouped into blocks are taken from different pixels, but are also taken from different bit positions. Where bit position is part of the context, bits with different bit positions will have different contexts. Thus, the blocks (sets of bits processed in parallel) output by buffer 504, D7-C6-B5-A4, D6-C5-B4-A3, and so on to the ninth block H7-G6-F5-E4, each comprise bits which do not depend on other bits in their block for context and do not share a context with any other bits in their block. Input pixels E, F, G and H are not shown, but follow pixel D.

In FIG. 11(b), there are no pixels preceding pixel A, to illustrate the state of the buffer following a reset. In the first parallel step after a reset of the buffer, a block with only one bit (from pixel A) is processed. In the next parallel step, one bit from pixel A and one bit from pixel B is processed. While the staggering of bits to avoid context conflicts means that not all parallel stages will be used in the first several blocks after a reset, this underutilization is insignificant for any reasonable image size. In the case of FIG. 11(b), it only occurs in the first three blocks.

FIGS. 13(a)–(b) illustrate a constraint a context model places on pipelined coders similar to the constraints imposed on parallel coders. FIG. 13(a) and 13(b) show the progress of a pipelined coder processing the pixels A–D shown in FIG. 11, with FIG. 13(a) showing a pipeline processing bits in an unreordered order and FIG. 13(b) showing a pipeline processing bits in a reordered order. In both figures, each column is labelled with a time, t, and shows the bit being operated upon by a pipeline stage. The stages shown in this example are an input stage, three intermediate stages (IS-1, IS-2 and IS-3), and two output stages.

In this example, assume that a bit is processed and available for determining the context of other bits in the first output stage, but no sooner. Further, assume that the processing of IS 1 depends on the context of the bit being processed, and the bitwise dependent context model is being used. With the bitwise dependent context model, the context of the circled bit A2 depends on A3, A4, A5, A6 and A7. In FIG. 13(a), this would mean that the processing of bit A2 in IS-1 cannot proceed at least until bits A3 and A4 are all the way to the first output stage (bits A5–A7 are already past the first output stage. This delay would defeat the benefits of pipelined processing.

To solve this problem, a reordering buffer such as buffer 502 can be used, to the effect shown in FIG. 13(b). In this example, the circled bit is B6, which gets its context from bit B7, which was output to the first output stage in an earlier period, and is therefore available when B6 is to be processed in IS-1.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of compressing input symbols, where each input symbol is selected from an alphabet of M symbols to represent a pixel in a palettized image, into codewords which are represented in fewer bits and from which the input symbols can be decoded, comprising the steps of:

selecting a context model;

reading an input stream of M-ary input symbols;

determining a distribution of contexts indicated by said context model over said input stream;

determining a distribution of said M-ary input symbols in said contexts over in said input stream;

assigning a first binary sequence to a first symbol of the M symbols in the alphabet, wherein said binary sequence is K bits, K being an integer greater than or equal to $\log_2 M$;

assigning subsequent binary sequences to subsequent symbols of the M symbols in the alphabet, wherein the subsequent binary sequence is the binary sequence, selected from all unassigned binary sequences, which results in a minimum partial bitwise entropy over a partial alphabet of symbols of the alphabet which have already been assigned a binary sequence and the selected binary sequence, thereby forming a reindexing table for translating any M-ary symbol to its assigned binarization;

repeating said step of assigning subsequent binary sequences at least until M−1 binary sequences are assigned to symbols;

assigning a remaining binary sequence to a remaining symbol, thus completing said reindexing table;

binarizing each M-ary input symbol using said reindexing table to form a bit stream; and entropy encoding said bit stream to form the codewords in a compressed codeword stream.

2. The method of claim 1, wherein said partial bitwise entropy is a sum of partial bit entropies over all contexts and all K bit positions of the binary sequences, where a partial bit entropy is an entropy of a ratio of a partial positional conditional probability and a partial conditional probability.

3. The method of claim 1, further comprising the step of transmitting said compressed codeword stream and said reindexing table to a decompressor.

4. The method of claim 3, further comprising the step of decompressing said compressed codeword stream after transmission to recover said bit stream as a decoded bit stream.

5. The method of claim 4, further comprising the step of deindexing said decoded bit stream using said reindexing table in reverse.

6. The method of claim 1, further comprising the steps of:

transmitting said compressed codeword stream to a decompressor;

decompressing said compressed codeword stream after transmission to recover said bit stream as a decoded bit stream; and translating said decoded bit stream according to context models derived from previously translated portions of said decoded bit stream.

7. The method of claim 1, wherein said context model is a bit position context model, wherein a context of a bit is determined by said bit's position within its binarization.

8. The method of claim 1, wherein said context model is a bit plane context model, wherein a context of a bit is determined by said bit's position within its binarization and a context symbol.

9. The method of claim 1, wherein said context model is a bitwise dependent context model, wherein a context of a bit is determined by previously processed bits, if any, of said bit's binarization.

10. The method of claim 1, wherein said context model is a first Markov bitwise dependent context model, wherein a context of a bit is determined by previously processed bits, if any, of said bit's binarization and a context symbol.

11. The method of claim 1, wherein said context model is a mixed context model, wherein a context of a bit is determined by previously processed bits, if any, of said bit's binarization, and bits of a binarization of a context symbol.

12. A method of compressing input symbols, where each input symbol is selected from an alphabet of M symbols to represent a pixel in a palettized image, into codewords which are represented in fewer bits and from which the input symbols can be decoded, comprising the steps of:

reading an input stream of M-ary input symbols;

binarizing said M-ary input symbols into a stream of binarized symbols;

identifying a context for each bit of each binarized symbol, wherein a context for said each bit is determined by said each bit's position within said each binarized symbol and a context symbol which is a symbol other than said each binarized symbol and is in a predefined relationship to said each binarized symbol, said predefined relationship being such that, when decoding, said each binarized symbol is decoded after said context symbol;

determining a binary entropy code for said contexts;

encoding each bit of said stream of binarized symbols according to said binary entropy code determined from the context of said each bit of said stream and the value of said each bit of said stream.

13. A method of compressing input symbols, where each input symbol is selected from an alphabet of M symbols to represent a pixel in a palettized image, into codewords which are represented in fewer bits and from which the input symbols can be decoded, comprising the steps of:

reading an input stream of M-ary input symbols;

binarizing said M-ary input symbols into a stream of binarized symbols;

identifying a context for each bit of each binarized symbol, wherein a context for said each bit is determined by said each bit's position within said each binarized symbol and bits of a binarization of a context symbol, said context symbol being a symbol other than said each binarized symbol in a predefined relationship to said each binarized symbol, said predefined relationship being such that, when decoding, said each binarized symbol is decoded after said context symbol;

determining a binary entropy code for said contexts;

encoding each bit of said stream of binarized symbols according to said binary entropy code determined from the context of said each bit of said stream and the value of said each bit of said stream.

14. A compression engine, for compressing M-ary symbols, each representing a pixel value in a palettized image and selected from an alphabet of M symbols, into codewords which are represented in fewer bits and from which the M-ary symbols can be extracted, the compression engine comprising:

means for determining a distribution of symbols in said input stream;

a reindex table generator which determines a binarization for each of the M possible symbols, said binarization is based on a distribution of the M-ary symbols, wherein said binarization is represented by a reindex table;

reindexing means for binarizing each M-ary symbol into a binary sequence according to said reindex table, thereby transforming the M-ary symbols representing the palettized image into a binary bit stream;

a binary entropy encoding compressor which compresses said binary bit stream and outputs a resulting codeword stream, wherein said binarization is selected to minimize the bitwise entropy of the binarized input stream.

15. The compression engine of claim 14, wherein the binarization results in a local minimum for said bitwise entropy out of all possible binarizations.

16. The compression engine of claim 14, wherein said binary sequences are of a fixed length of K bits, where K is greater than or equal to $\log_2 M$.

17. The compression engine of claim 14, wherein said binary entropy encoding compressor comprises a context modeler, a probability estimation module, and a bit generator.

18. An entropy encoder, wherein input symbols are encoded based on a context provided by context symbols, which are also input symbols, comprising:

symbol reordering means, coupled to a symbol input of the entropy encoder, for reordering input symbols from an input stream order to a reordered stream order;

a context modeler, coupled to an output of said symbols reordering means, which accepts input symbols in said reordered stream order and stores input symbols as necessary to determine context of a current input symbol from said current input symbol's context symbols;

a probability estimator, coupled to receive said current input symbol and a context of said current input symbol from said context modeler, for estimating the probability of said current input symbol occurring given its context; and a bit generator, coupled to said probability estimator, for generating codewords based on probability estimates provided by said probability estimator, said codewords being a compressed representation of said reordered stream of input symbols, wherein said symbol reordering means reorders input symbols such that a reordered distance between said current input symbol and said current input symbol's context symbols in said reordered stream is greater than an original distance between said current input symbol and said current input symbol's context symbols in said input stream.

19. The apparatus of claim 18, further comprising a decoder, said decoder comprising:

a second context modeler, which stores decoded input symbols as necessary to determine context of a current input symbol;

a second probability estimator, coupled to receive a context of said current input symbol from said second context modeler;

a second bit generator, coupled to receive said codewords output by said bit generator, for generating a symbol stream from said codewords based on probability estimates provided by said second probability estimator;

symbol deordering means, coupled to a symbol output of said second context modeler, for reordering decoded input symbols from said reordered stream order to said input stream order, thereby increasing a delay between said context symbols being decoded and said current input symbols being decoded.

20. The apparatus of claim 19, further comprising a means for decoding said codewords in parallel, wherein said increased delay is sufficient to allow parallel decoding while providing context symbols as needed by said decoder.

21. An entropy coder, wherein a plurality of bits taken from an input bit stream are coded in parallel, comprising:

a context modeler which accepts an input bit and outputs a pairing of said input bit with an associated context of said input bit, said context determined from at least one of previously input bits, said input bit's position within an input symbols and a predetermined context model;

a context-sensitive parallel coder, coupled to receive pairings output from said context modeler, which generates codewords based on probability estimates of input bits given said paired contexts, said codewords being a compressed representation of said stream of input bits, and said parallel coder comprising:

means for forming a parallel stream of input bits, grouping N bits into a set of bits; and a plurality of N coding stages, each of which processes one input bit from said set of bits so grouped; and bit reordering means, coupled between an input for the input bit stream and said context modeler, for reordering input bits such that a context of a bit in a set of bits is independent of other bits in said set of bits.

22. The entropy coder of claim 21, wherein said bit reordering means also reorders said input bit stream such that no two bits in a set of bits processed in parallel share a common context.

23. An entropy coder, wherein a plurality of bits taken from an input bit stream are coded in a pipeline of a plurality of stages, comprising:

a context modeler which accepts an input bit and outputs a pairing of said input bit with an associated context of said input bit, said context determined from at least one of previously input bits, said input bit's position within an input symbols and a predetermined context model;

a context-sensitive pipeline coder, coupled to receive pairings output from said context modeler, which generates codewords based on probability estimates of input bits given said paired contexts, said codewords being a compressed representation of said stream of input bits, and said pipeline coder comprising:

an input stage, which processes input bits output by said context modeler;

a plurality of intermediate stages which process outputs of said input stage, each coupled to other stages in a pipelined manner, wherein at least one stage is a context-sensitive stage which processes an input bit based on said input bit's paired context; and an output for a final stage of said plurality of intermediate stages; and bit reordering means, coupled between an input for the input bit stream and said context modeler, for reordering input bits such that a context of a given bit is independent of other bits being processed in said plurality of intermediate stages when said given bit is being processed in said context-sensitive stage.

24. The entropy coder of claim 23, wherein said bit reordering means also reorders said input bit stream such that no two bits in the pipeline at any given time share a common context.

* * * * *